United States Patent
Yuan et al.

(10) Patent No.: US 11,515,059 B2
(45) Date of Patent: Nov. 29, 2022

(54) ALL-WEATHER SELF-HEALING STRETCHABLE CONDUCTIVE MATERIAL AND PREPARATION METHOD THEREOF

(71) Applicants: CHANGZHOU UNIVERSITY, Jiangsu (CN); JIANGSU UNIVERSITY, Jiangsu (CN)

(72) Inventors: Ningyi Yuan, Jiangsu (CN); Jianning Ding, Jiangsu (CN); Shengping Dai, Jiangsu (CN)

(73) Assignees: Changzhou University, Jiangsu (CN); Jiangsu University, Jiangsu (CN)

( * ) Notice: Subject to any disclaimer, the term of this patent is extended or adjusted under 35 U.S.C. 154(b) by 189 days.

(21) Appl. No.: 16/795,721

(22) Filed: Feb. 20, 2020

(65) Prior Publication Data

US 2020/0258649 A1 Aug. 13, 2020

Related U.S. Application Data

(63) Continuation of application No. PCT/CN2018/088155, filed on May 24, 2018.

(30) Foreign Application Priority Data

Mar. 20, 2018 (CN) .......................... 201810228218.0

(51) Int. Cl.
*H01B 1/22* (2006.01)
*C01B 32/05* (2017.01)
(Continued)

(52) U.S. Cl.
CPC .............. *H01B 1/22* (2013.01); *C01B 32/05* (2017.08); *C09D 5/02* (2013.01); *C09D 133/02* (2013.01);
(Continued)

(58) Field of Classification Search
CPC ................ C08J 2333/02; C08J 2377/04; C08J 2433/02; C08J 2477/04; C08J 3/075;
(Continued)

(56) References Cited

U.S. PATENT DOCUMENTS

2015/0098167 A1* 4/2015 El-Kady ................ H01G 11/24
361/502
2018/0086893 A1 3/2018 Tai et al.
(Continued)

FOREIGN PATENT DOCUMENTS

CN 102942832 A 2/2013
CN 103171187 A 6/2013
(Continued)

OTHER PUBLICATIONS

Du "Recent Achievements of Self-Healing Graphene/Polymer Composites." Polymers 2018, 10, 114. (Year: 2018).*
(Continued)

*Primary Examiner* — Tri V Nguyen
(74) *Attorney, Agent, or Firm* — Thomas E. Lees, LLC

(57) ABSTRACT

Disclosed is a preparation method of an all-weather self-healing stretchable conductive material, which uses acrylic acid and modified polyglutamic acid as a substrate, adds $Fe^{3+}$ to form coordination, adjusts the volume ratio of water and glycerin, and heats to generate radical polymerization, so as to obtain a uniform double-layer three-dimensional network structure. The obtained polyacrylic acid and polyglutamic acid composite hydrogel has good mechanical properties and characteristics of rapid self-healing. A composite carbon film is prepared by depositing a metal layer of 20 nm to 80 nm thick on a single-layer aligned carbon film by magnetron sputtering, and then the composite hydrogel is adhered to each of the upper and lower sides of the composite carbon film respectively to form an all-weather self-
(Continued)

healing stretchable conductive material of a sandwich structure. The preparation method of the invention is simple, the source of raw materials is plenty, and the obtained materials have good electrical and mechanical properties and have broad application prospects in the fields of flexible stretchable devices, wearable devices, and soft-bodied robots and the like.

8 Claims, 12 Drawing Sheets

(51) Int. Cl.
  *C23C 14/18*   (2006.01)
  *C23C 14/35*   (2006.01)
  *H01B 1/02*   (2006.01)
  *H01B 1/24*   (2006.01)
  *H01B 5/14*   (2006.01)
  *H01B 13/00*   (2006.01)
  *C09D 5/02*   (2006.01)
  *C09D 133/02*   (2006.01)

(52) U.S. Cl.
  CPC ............ *C23C 14/185* (2013.01); *C23C 14/35* (2013.01); *H01B 1/02* (2013.01); *H01B 1/24* (2013.01); *H01B 5/14* (2013.01); *H01B 13/0036* (2013.01)

(58) Field of Classification Search
  CPC ........ C09J 133/26; C08F 283/04; H01B 1/22; H01B 1/02; H01B 1/24; H01B 5/14; H01B 13/00; C01B 32/05; C09D 5/02; C09D 133/02; C23C 14/185; C23C 14/35
  USPC .............................................. 428/148, 478.2
  See application file for complete search history.

(56) References Cited

U.S. PATENT DOCUMENTS

| | | | |
|---|---|---|---|
| 2018/0092944 A1* | 4/2018 | Kim | ..................... A61K 9/7092 |
| 2018/0251649 A1* | 9/2018 | Lewis | .................... B33Y 70/00 |

FOREIGN PATENT DOCUMENTS

| | | |
|---|---|---|
| CN | 103242656 A | 8/2013 |
| CN | 104497229 A | 4/2015 |
| CN | 104538202 A | 4/2015 |
| CN | 105482040 A | 4/2016 |
| CN | 106146729 A | 11/2016 |
| CN | 106229038 A | 12/2016 |
| CN | 106893120 A | 6/2017 |
| CN | 107759809 A | 3/2018 |
| EP | 2597110 A1 | 5/2013 |
| KR | 20160125035 A | 10/2016 |

OTHER PUBLICATIONS

Strandman "Self-Healing Supramolecular Hydrogels Based on Reversible Physical Interactions." Gels 2016, 2, 16. (Year: 2016).*
International Search Report for PCT Application No. PCT/CN2018/088155; State Intellectual Property Office of P.R. China; Beijing, China; dated Dec. 14, 2018.
Written Opinion of the International Searching Authority for PCT/CN2018/088155; State Intellectual Property Office of P.R. China; Beijing, China; dated Dec. 14, 2018.
Translation of the Written Opinion of the International Searching Authority for PCT/CN2018/088155; State Intellectual Property Office of P.R. China; Beijing, China; dated Dec. 14, 2018.
Chinese First Office Action for Chinese Patent Application No. 201810228218.0; The State Intellectual Property Office of People's Republic China; Beijing, China; dated Oct. 31, 2019.
Chinese First Search Report for Chinese Patent Application No. 201810228218.0; The State Intellectual Property Office of People's Republic China; Beijing, China; dated Oct. 23, 2019.
Chinese Supplemental Search Report for Chinese Patent Application No. 201810228218.0; The State Intellectual Property Office of People's Republic China; Beijing, China; dated Mar. 24, 2020.

* cited by examiner

US 11,515,059 B2

ALL-WEATHER SELF-HEALING STRETCHABLE CONDUCTIVE MATERIAL AND PREPARATION METHOD THEREOF

CROSS REFERENCE TO RELATED APPLICATIONS

This is a Continuation application of International Application Serial No. PCT/CN2018/088155, filed on May 24, 2018, which claims the benefit of Chinese Application No. 201810228218.0, filed on Mar. 20, 2018, the disclosures of which are hereby incorporated by reference.

BACKGROUND

The present application relates to the technical field of new materials, and particularly relates to an all-weather self-healing stretchable conductive material and a preparation method thereof.

Since the 1940s, hydrogel research in the fields of bionics, chemistry, and medicine and the like has been continued. Hydrogel is a three-dimensional network structure polymer compound that provides a large specific surface area, which renders it a strong mechanical strength, ductility, viscosity, toughness and restorability. In the 1980s, scientists developed a new type of self-healing material that was inspired by self-repairing biological systems. This type of self-healing material helps to improve the life and safety of the device. Self-healing materials can be completely or partially restored to their original state after physical, chemical or mechanical damage, most of which are achieved by reversible interactions between polymer skeleton such as hydrogen bonds, covalent bonds, and intermolecular forces. However, the comprehensive performance is still unsatisfactory, especially, as the climate changes, the electrical resistance of the conductive hydrogel changes significantly with temperature and humidity, which greatly limits the development of hydrogel.

In recent years, people's requirements for portable electronic devices have been continuously increased and more and more flexible device materials such as wearable electronic devices and electronic skins have been studied, and their characteristics such as environmental friendliness, performance stability, and longevity have attracted much attention. In general, the conductive hydrogel is composed of an insulated porous skeleton and a conductive filler material, for example, a conductive polymer, such as polypyrrole, polyaniline, polythiophene, ionic liquid, and carbon nanotubes, and the like, as an active material. The electrical conductivity and mechanical strength of conductive hydrogels have not yet reached the requirements of humans. Therefore, it is of great significance to produce conductive hydrogel materials with high mechanical strength and excellent electrochemical performance by simple and convenient methods.

BRIEF SUMMARY

An object of the present application is to provide a stretchable conductive material and preparation method thereof. The conductive material has good self-healing ability as well as constant conductivity under different temperatures and humidity conditions, and the conductivity thereof remains unchanged in the case of stretching.

The inventive concept of the disclosure includes: using rich carboxyl group in acrylic acid and γ-polyglutamic acid to coordinate with $Fe^{3+}$ so as to form a double-layer three-dimensional network structure, so that that it has strong tensile and self-healing properties; changing the solvent combination of glycerin and water, so that the mass of the hydrogel remains unchanged; then forming a composite conductive material of a "sandwich" structure including an intermediate layer of an aligned composite carbon film sputtered with metal (silver, gold, copper), and self-healing hydrogels at either sides. The conductive material has constant conductivity at different temperatures and humidity conditions, and the conductivity thereof remains unchanged in the case of stretching.

The technical scheme of the invention is as follows: firstly, obtaining polyacrylic acid and polyglutamine acid composite hydrogel by using acrylic acid (PAA) and modified polyglutamic acid (γ-PGAA) hydrogel as a skeleton, and ferric chloride hexahydrate ($FeCl_3 \cdot 6H_2O$) as a metal ion complexing agent, N, N'-methylenebisacrylamide (MBAA) as a crosslinking agent, ammonium persulfate (APS) as an initiator, and glycerin (GC) and water ($H_2O$) as a mixed solvent; adhering the composite hydrogel, in a stretched state, to an aligned composite carbon film sputtered with metal, and after the composite hydrogel shrinks to its original length, adhering another piece of hydrogel to the other side of the carbon film, so as to form a stretchable conductive material of a "sandwich" structure including an intermediate layer of a composite carbon film sputtered with metal, and self-healing hydrogels at either sides.

The preparation method of the conductive material of the present application is as follows:

(1) preparing a solution of acrylic acid, modified polyglutamic acid (γ-PGAA), ferric chloride hexahydrate ($FeCl_3 \cdot 6H_2O$), N,N'-methylenebisacrylamide (MBAA), ammonium persulfate (APS) Glycerol (GC) and $H_2O$ in proportion; passing nitrogen gas for 30 minutes after mixing the solution uniformly so as to remove the gas in the solution, and effecting polymerization at 60° C. for 30 minutes to obtain a composite hydrogel.

(2) attaching an aligned carbon film to a glass plate, and sputtering a metal (silver, gold, copper) on the single-layer-aligned carbon film by magnetron sputtering so as to prepare a composite carbon film.

(3) adhering the hydrogel obtained in the step (1) and stretched by 200-500% to the composite carbon film, and after the hydrogel shrinks to its original length, adhering another piece of hydrogel to the other side of the carbon film so as to form a stretchable conductive material of a "sandwich" structure including an intermediate layer of a composite carbon film sputtered with metal (silver, gold, copper), and self-healing hydrogels at either sides.

In step (1), a volume ratio of GC and $H_2O$ is between 0:6 and 6:0, an amount of γ-PGAA solution is 0%~80% of a total mass of the solution, and an amount of MBAA is 0%~0.4% of a mass of acrylic acid, an amount of APS is 2% of the mass of acrylic acid, and an amount of $FeCl_3 \cdot 6H_2O$ is 1.25% of the amount of acrylic acid substance. When the volume ratio of GC:$H_2O$ is 5:1, the amount of γ-PGAA solution is 40% of the total mass of the solution, the amount of MBAA is 0.2% of the mass of acrylic acid, the amount of APS is 2% of the mass of acrylic acid, and the amount of $FeCl_3 \cdot 6H_2O$ is 1.25% of the amount of the acrylic acid substance, the hydrogel prepared has a faster healing rate, a higher breaking elongation, and a long-term preservation.

The γ-PGAA is prepared by the following process: dissolving 2 g γ-PGA and 4 g allyl glycidyl ether fully in 25 mL deionized water, adjusting the pH to 2 to 4 with acetic acid, and reacting at room temperature for 36 hours; effecting extraction for three times with dichloromethane, and collecting aqueous layer to obtain a γ-PGAA solution, so that a 50 mg/mL aqueous solution of γ-PGAA is prepared, where γ-PGA is a white powder having a molecular weight of 10 to 70 w.

A process of sputtering metal on the single-layer carbon film in the step (2) is as below: spreading the carbon film on a glass slide having a length of 7.5 cm and a width of 2.5 cm, and sputtering a metal layer of a thickness of 20~80 nm on the carbon film by magnetron sputtering and rendering the carbon film coated with the sputtered metal to have a resistance of 2~10 ohms, thus a composite carbon film covered by the metal layer is obtained.

The disclosure also provides a usage of an all-weather self-healing composite conductive hydrogel, with the prepared composite conductive hydrogel being used in the fields of biomimetic biology, flexible electronic equipment or biosensors, wearable devices, soft-bodied robots, and the like.

The invention is mainly embodied in an all-weather self-healing stretchable conductive material. The conductive material prepared by the above method has a breaking elongation up to 2875%; a self-healing recovery time as low as 3 h, a self-healing efficiency of 98.8%; a square resistance as low as 2 ohms. When the ambient temperature is –30° C. to 60° C., the resistance is maintained at about 2 ohms; when the ambient humidity is 15% to 80%, the resistance remains at about 2 ohms. The method adopts human-friendly polyglutamic acid to effect modification, ingeniously avoiding the flocculent precipitate generated by γ-polyglutamic acid and metal ions, increasing the degree of cross-linking of the three-dimensional network structure with acrylic acid, enhancing the tensile strength of the hydrogel, and reducing the self-healing time. The prepared conductive material maintains good electrical conductivity under different conditions of temperature and humidity, and the electrical conductivity remains unchanged under the condition of stretching.

DETAILED DESCRIPTION

Figure 1:
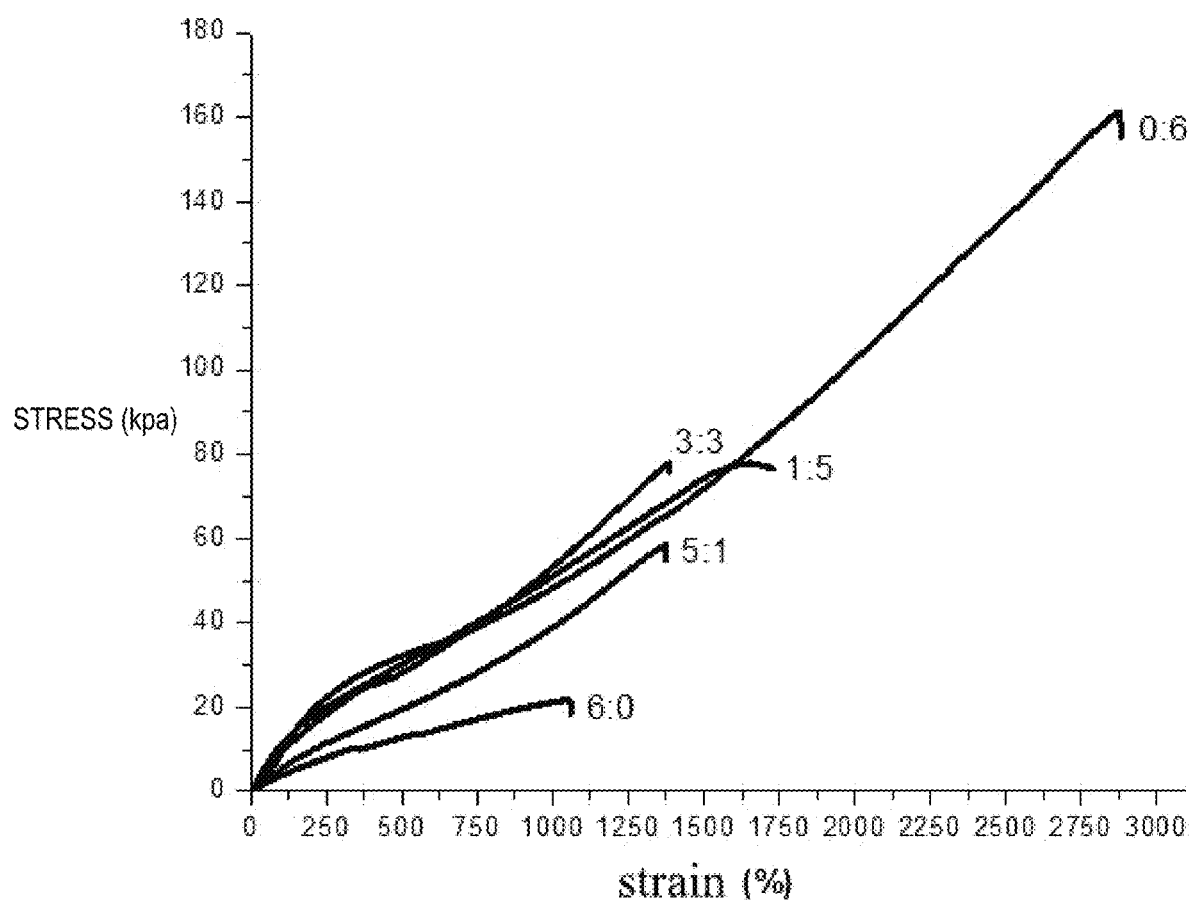
FIG. 1 is a graph showing stress-strain curves of hydrogels of mixed solvents of different proportions of glycerin and water prepared according to Example 1.

In the following, the invention will be further illustrated by embodiments, which are merely intended to illustrate the invention rather than limiting the scope of the invention. The embodiments will be explained by way of examples. The specific processes are shown below.

Example 1

(1) Dissolving 2 g γ-PGA (white powder having a molecular weight of 10 to 70 w) and 4 g allyl glycidyl ether sufficiently in 25 mL deionized water, adjusting the pH to 2-4 with acetic acid, and stirring at room temperature and effecting reaction for 36 h; then, extracting three times with dichloromethane, and collecting an upper layer of γ-PGAA aqueous solution to obtain a 50 mg/mL γ-PGAA aqueous solution.

(2) Taking 2 g acrylic acid, 4 mL γ-PGAA solution, 4 mg MBAA, 40 mg APS, 0.056 g $FeCl_3.6H_2O$, mixing them uniformly in GC:$H_2O$ with a volume ratio of 0:6, 1:5, 3:3, 5:1, 6:0, passing nitrogen gas for 30 minutes to remove the gas in the solution, and effecting polymerization at 60° C. for 30 minutes to obtain a composite hydrogel having a different solvent volume ratio. When the content of γ-PGAA solution is 0 mL, the content of $FeCl_3.6H_2O$ is 0 mg, and the volume ratio of GC:$H_2O$ is 0:6, the prepared hydrogel is labeled as PAA hydrogel; when the content of γ-PGAA solution is 4 mL, the content of $FeCl_3.6H_2O$ is 0 mg, the volume ratio of GC:$H_2O$ is 0:6, the prepared hydrogel is labeled as PAA+γ-PGAA/$H_2O$ hydrogel; when the content of γ-PGAA solution is 4 mL, the content of $FeCl_3.6H_2O$ is 0.056 g, the volume ratio of GC:$H_2O$ is 0:6, the prepared hydrogel is labeled as PAA+γ-PGAA+$Fe^{3+}$/GC+$H_2O$ hydrogel; when the content of γ-PGAA solution is 4 mL, the content of $FeCl_3.6H_2O$ is 0.056 g, and the volume ratio of GC:$H_2O$ is 5:1, the prepared hydrogel is labeled as PAA+γ-PGAA+$Fe^{3+}$/GC+$H_2O$ hydrogel.

Example 2

As a replacement of step (2) in Example 1, taking 2 g acrylic acid, 4 mg MBAA, 40 mg APS, 0.056 g $FeCl_3.6H_2O$, with the ratio of GC:$H_2O$ being 5:1, and the γ-PGAA solution was 0 mL, 2 mL, 4 mL, 6 mL and 8 mL, respectively. After the solution was uniformly mixed, passing nitrogen gas for 30 minutes to remove the gas in the solution, and effecting polymerization at 60° C. for 30 minutes to obtain composite hydrogels having different γ-PGAA contents. The remaining steps were the same as in Example 1.

Example 3

As a replacement of step (2) in Example 1, taking 2 g acrylic acid, 4 mL γ-PGAA, 40 mg APS, and 0.056 g $FeCl_3 \cdot 6H_2O$, with the volume ratio of $GC:H_2O$ being 5:1, and the mass of MBAA was 0 mg, 2 mg, 4 mg, 6 mg, 8 mg respectively. After the solution was uniformly mixed, passing nitrogen gas for 30 minutes to remove the gas in the solution, and effecting polymerization at 60° C. for 30 minutes to obtain polyacrylic acid and polyglutamic acid composite hydrogels having different MBAA contents. The remaining steps were the same as in Example 1.

Example 4

(1) Spreading a single-layer-aligned carbon film on a glass slide of 7.5 cm length and 2.5 cm width, and depositing a silver layer of about 50 nm thick on the carbon film by magnetron sputtering. The composite carbon film with sputtered silver has a resistance of about 3 ohms.

(2) Adhering a hydrogel, which was prepared where the volume content of the γ-PGAA solution is 40%, the mass concentration of MBAA relative to acrylic acid is 0.2%, the mass concentration of APS relative to acrylic acid is 2%, the amount-of-substance concentration of $FeCl_3 \cdot 6H_2O$ relative to acrylic acid is 1.25%, and a volume ratio of $GC:H_2O$ is 5:1, and stretched by 200%, to the composite carbon film with sputtered silver; after the stretched hydrogel shrinking to the original length, another piece of same hydrogel is attached to the other side of the carbon film so as to form a sandwich type conductive material with an intermediate layer being composite carbon film sputtered with silver and self-healing hydrogels locating at either sides.

Figure 2:
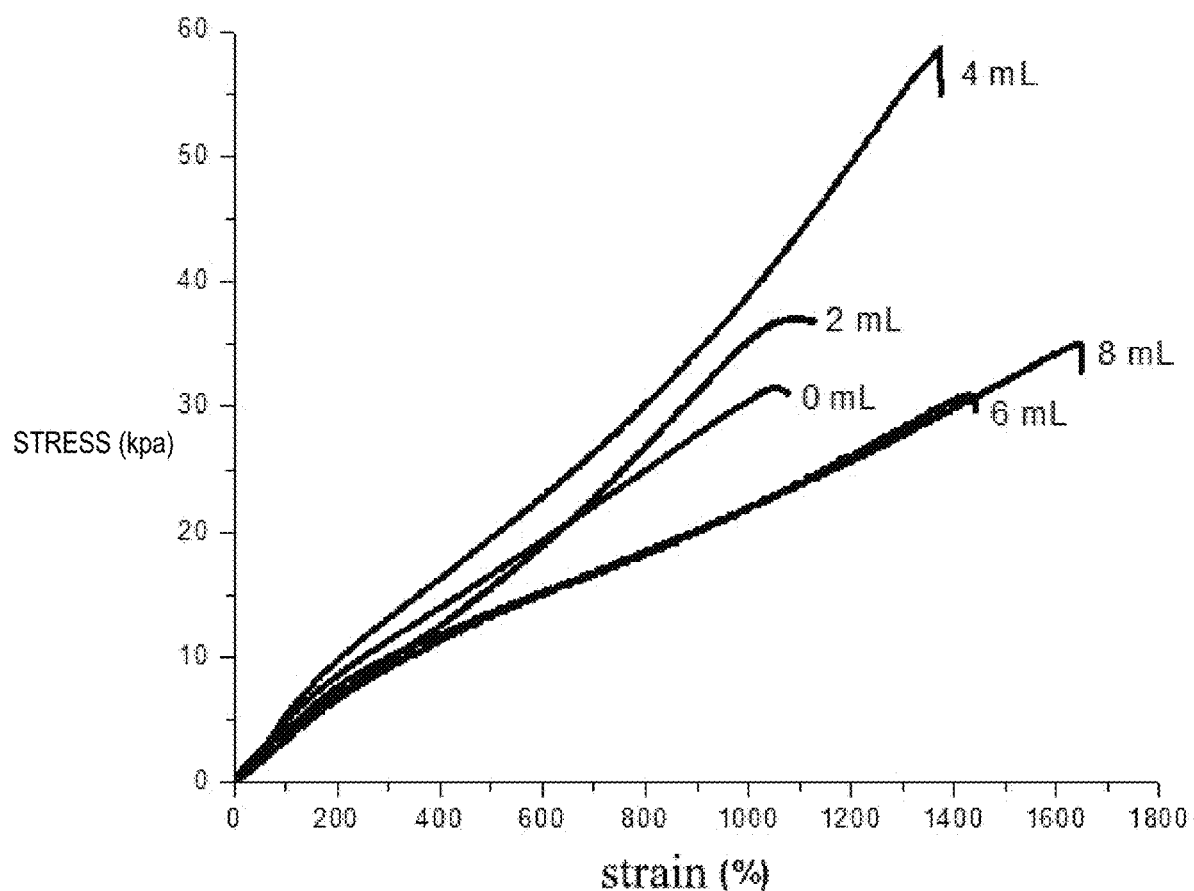
FIG. 2 is a graph showing stress-strain curves of hydrogels of different γ-PGAA concentrations prepared according to Example 2.
Figure 3:
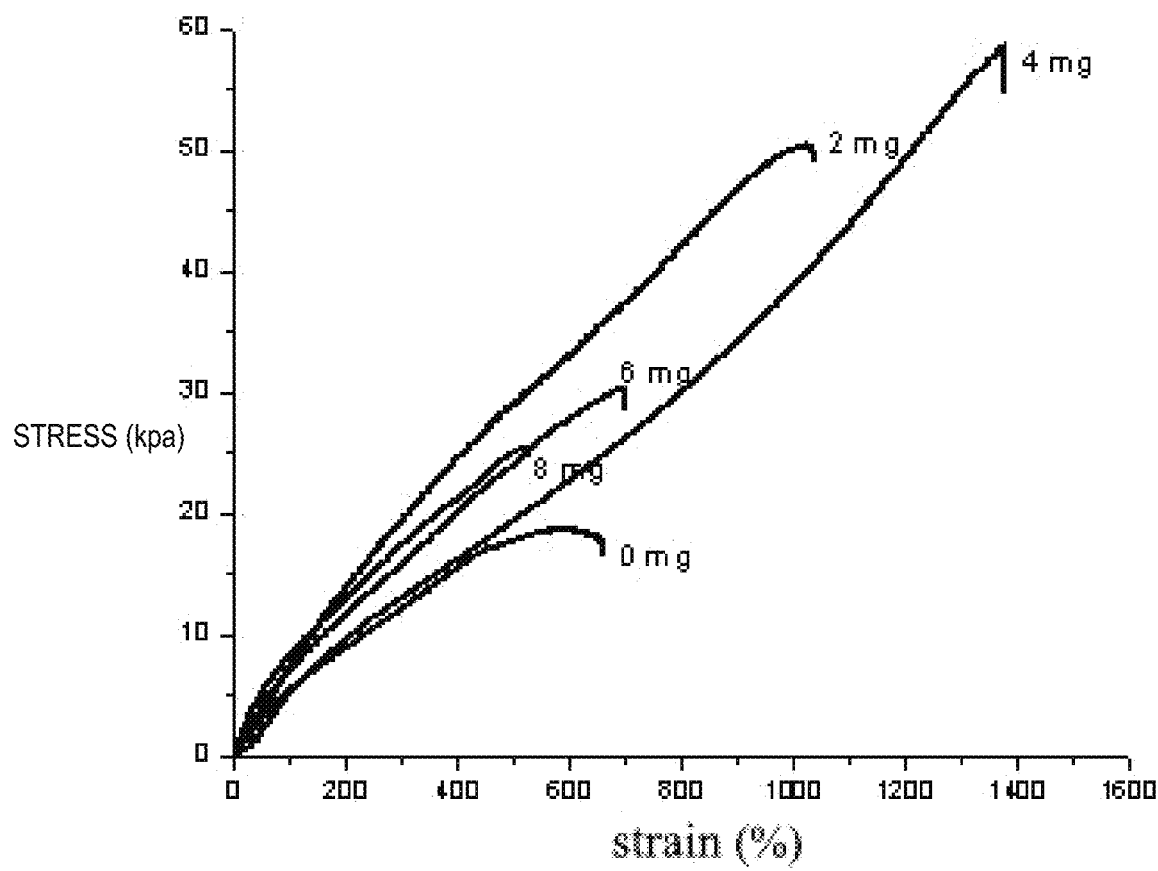
FIG. 3 is a graph showing stress-strain curves of hydrogels of different MBAA concentrations prepared according to Example 3.
Figure 4:
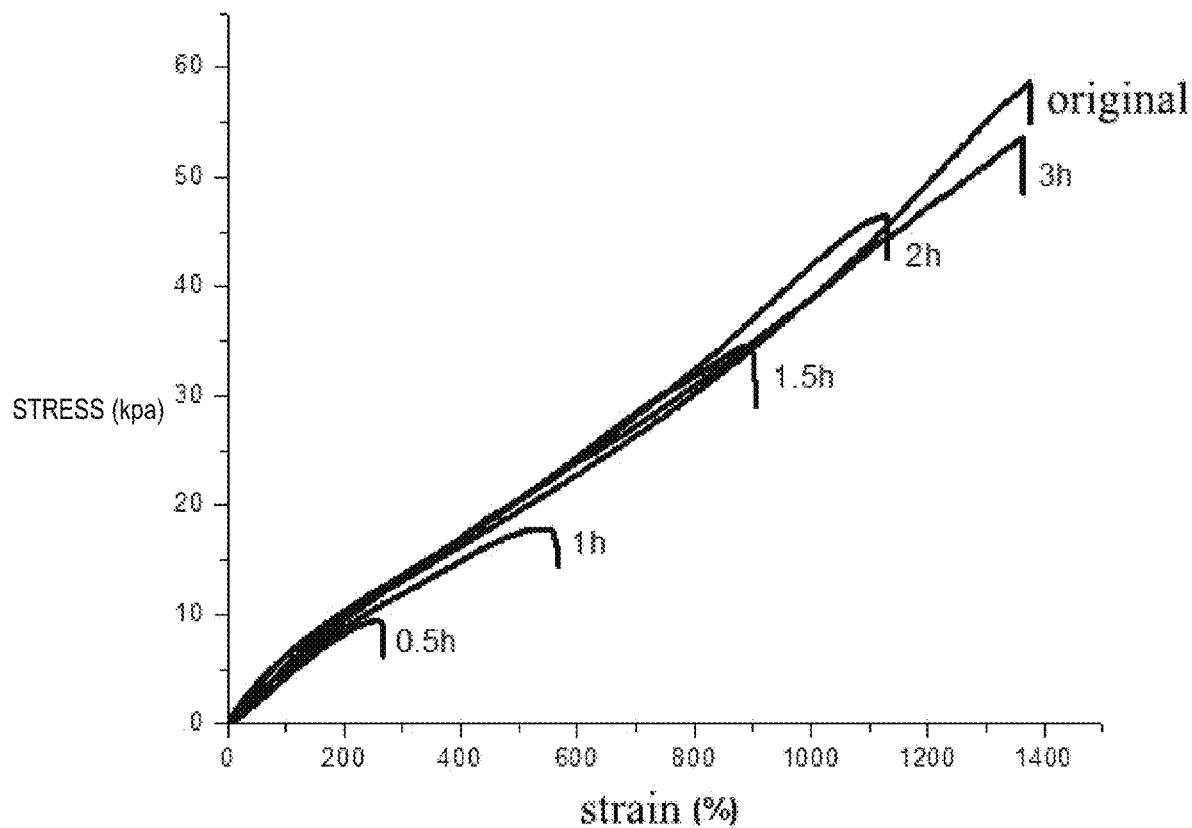
FIG. 4 is a graph showing stress-strain curves of PAA+γ-PGAA+$Fe^{3+}$/GC+$H_2O$ hydrogels prepared according to Example 3 for different time periods.

The mechanical properties of the hydrogels of Examples 1, 2, and 3 were studied respectively by using a universal trial machine. The samples used for the tensile test were rectangular parallelepipeds of dimensions of 5×1×0.2 $cm^3$, the tensile loading rate was 10 mm/min, and the test result was the average value of five tests. As shown in FIGS. 1, 2 and 3, it was found that when the volume content of the γ-PGAA solution was 40%, the mass concentration of MBAA relative to acrylic acid was 0.2%, and the mass concentration of APS relative to acrylic acid was 2%, the amount-of-substance concentration of $FeCl_3 \cdot 6H_2O$ relative to acrylic acid was 1.25%, and the volume ratio of $GC:H_2O$ was 0:6, the hydrogel prepared had an elongation at break up to 2875%. FIG. 4 shows stress-strain curves of PAA+γ-PGAA+$Fe^{3+}$/GC+$H_2O$ hydrogels for different time periods. The degree of self-healing is judged by the breaking elongation of the hydrogel restored after different time periods. Before 1.5 h, the self-healing efficiency reached 65.4%; then the self-healing speed became slower, the time for restoration by self-healing was 3 h with a self-healing efficiency of 98.8%.

Figure 5:
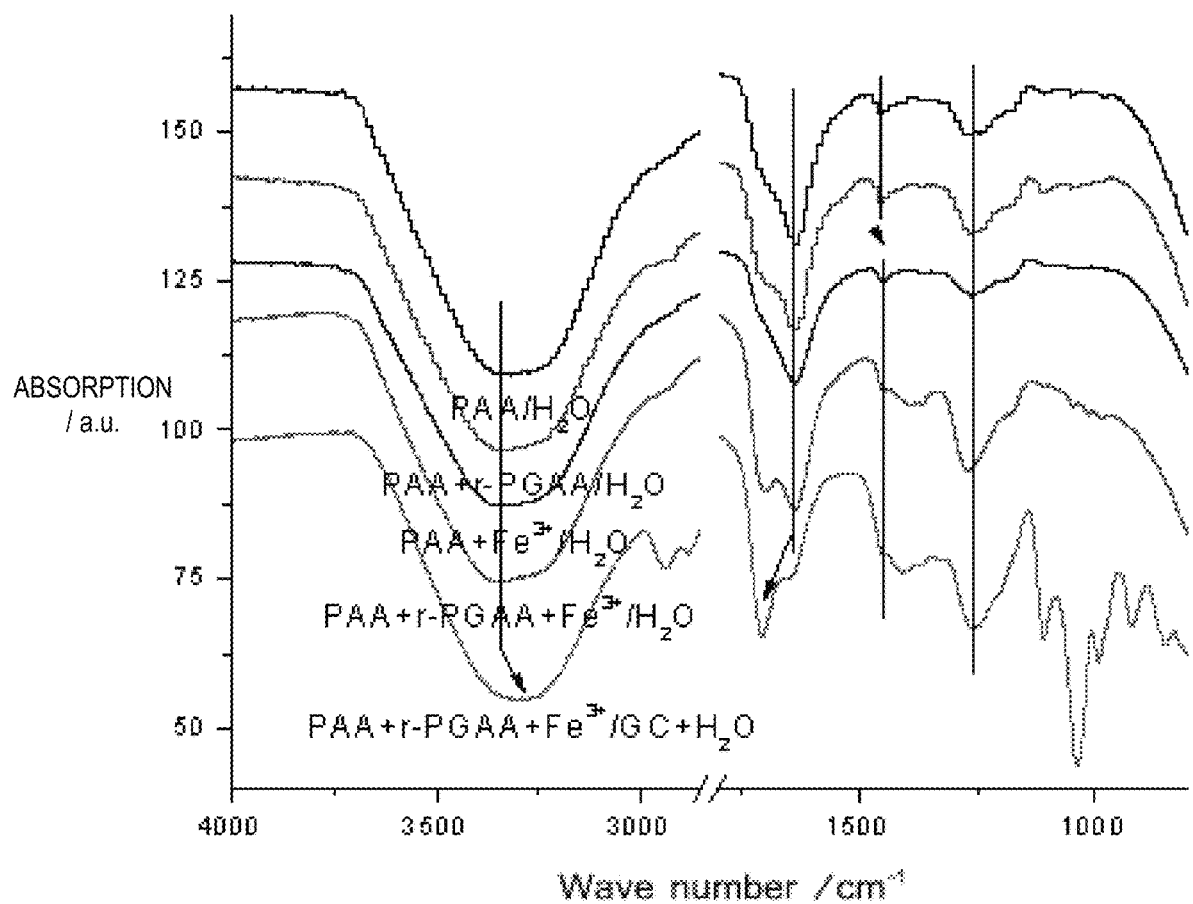
FIG. 5 is an infrared spectrum of a hydrogel prepared according to Examples 1, 2, and 3.

The structure of PAA hydrogel, PAA+γ-PGAA/$H_2O$ hydrogel, PAA+$Fe^{3+}$/$H_2O$ hydrogel, PAA+γ-PGAA+$Fe^{3+}$/GC+$H_2O$ hydrogel and PAA+γ-PGAA+$Fe^{3+}$/GC+$H_2O$ hydrogel are analyzed by using a Fourier infrared spectrometer. As shown in FIG. 5, there are four peaks for PAA hydrogel, respectively at 3350, 1636, 1457 and 1256 $cm^{-1}$, which are respectively attributed to the stretching vibration peak of NH in the amide group, C=O stretching vibration, O—H deformation vibration and C—O stretching vibration. In the infrared spectrum of PAA+γ-PGAA+$Fe^{3+}$/GC+$H_2O$ hydrogel, the stretching vibration peak labeled as N—H in the amide group jumps from 3350 to 3285 $cm^{-1}$, and at 1636 $cm^1$ the stretching vibration peak labeled as C—O is weakened, which is most likely because the addition of glycerin enhances the hydrogen bond in the hydrogel. At the same time, the stretching vibration peak labeled as C=O at 1709 $cm^{-1}$ strengthens gradually, and the deformation vibration peak labeled as O—H jumps from 1459 to 1457 $cm^{-1}$, which are probably because the addition of $Fe^{3+}$ causes formation of a coordinate bond between metal and carboxyl group.

Figure 6:
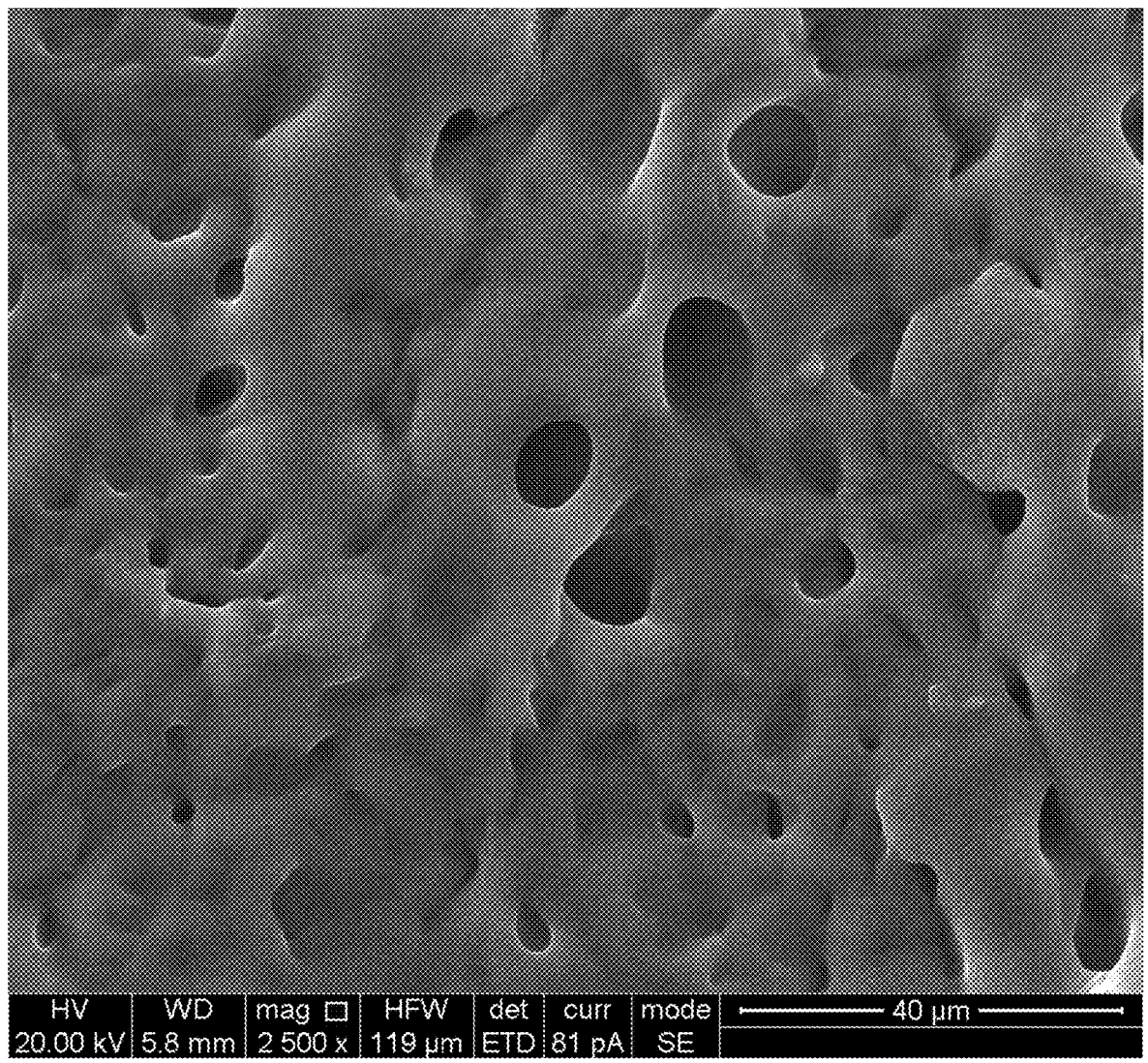
FIG. 6 is a SEM image of a PAA+γ-PGAA+$Fe^{3+}$/$H_2O$ hydrogel prepared according to Example 3.
Figure 7:
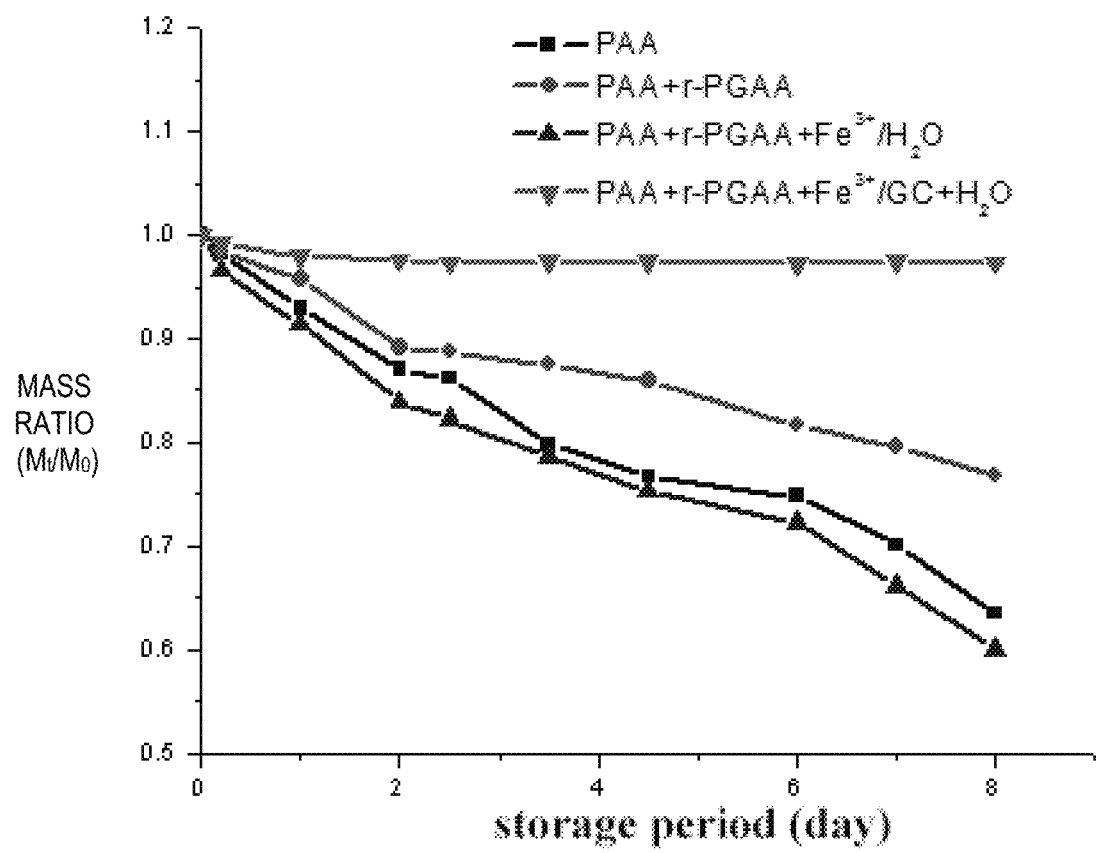
FIG. 7 is a graph showing curves of mass change rate versus time for hydrogels prepared according to Example 3.

The PAA+γ-PGAA+$Fe^{3+}$/GC+$H_2O$ hydrogel prepared in Example 1 was freeze-dried for 12 h, and thereafter the surface morphology of the hydrogel was observed by a scanning electron microscopy (SEM, FEI Quanta650). As a result, the hydrogel was found to have a porous mesh structure as shown in FIG. 6. The PAA hydrogel, the PAA+γ-PGAA/$H_2O$ hydrogel, the PAA+γ-PGAA+$Fe^{3+}$/$H_2O$ hydrogel and the PAA+γ-PGAA+$Fe^{3+}$/GC+$H_2O$ hydrogel were placed at room temperature and the curves of mass change rate versus time for the four hydrogels are recorded. It was found that the mass of the PAA hydrogel, the PAA+γ-PGAA/$H_2O$ hydrogel, the PAA+γ-PGAA+$Fe^{3+}$/$H_2O$ hydrogel gradually decreased, while the mass of the PAA+γ-PGAA+$Fe^{3+}$/GC+$H_2O$ hydrogel did not change much, as shown in FIG. 7.

Figure 8A:
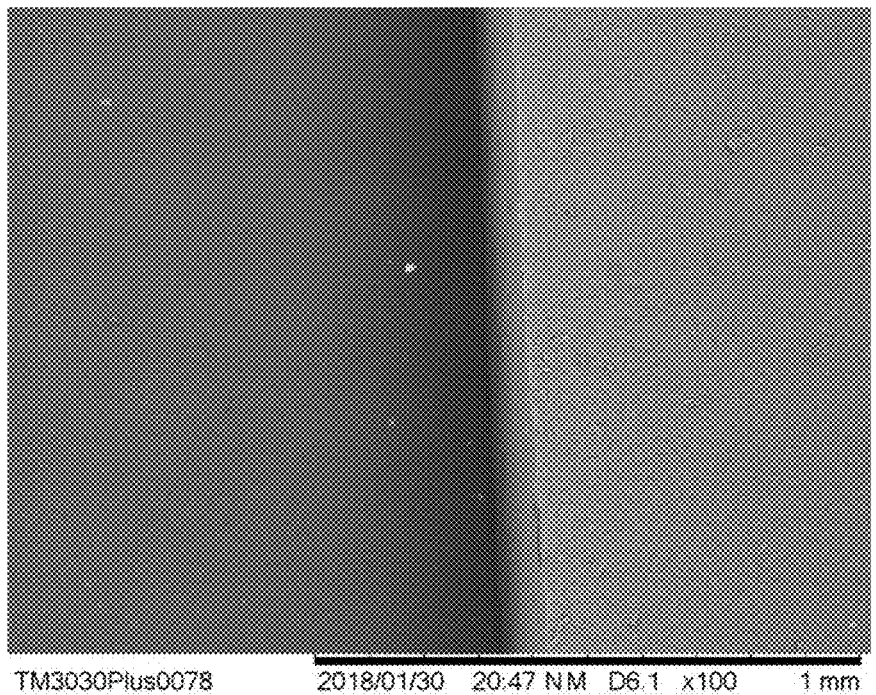
FIG. 8A is a SEM image before self-healing which shows the self-healing effect of a PAA+γ-PGAA+$Fe^{3+}$/GC+$H_2O$ hydrogel prepared according to Example 3.
Figure 8B:
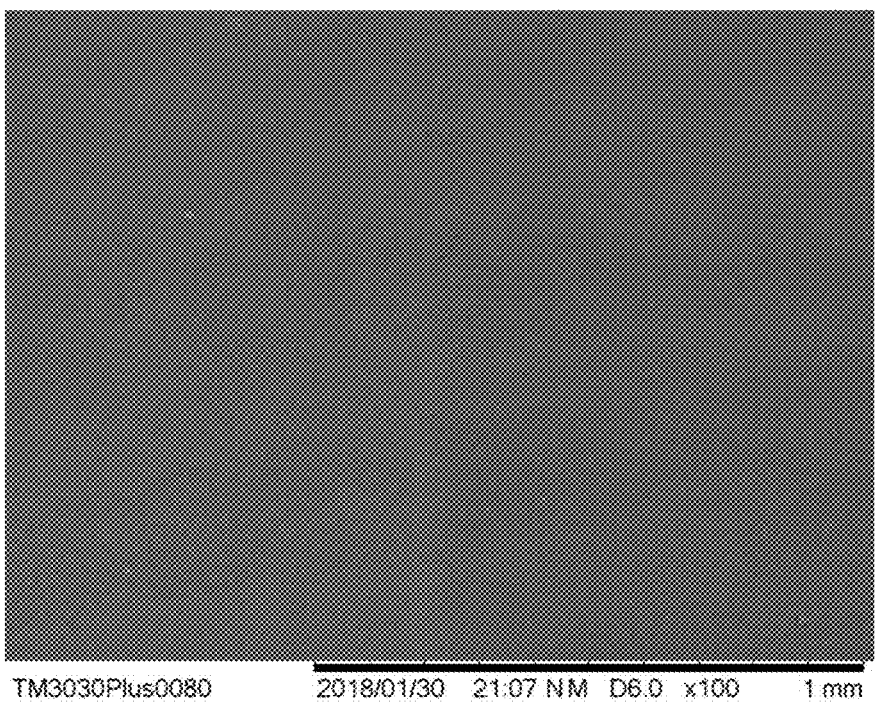
FIG. 8B is a SEM image after self-healing which shows the self-healing effect of a PAA+γ-PGAA+$Fe^{3+}$/GC+$H_2O$ hydrogel prepared according to Example 3.
Figure 9:
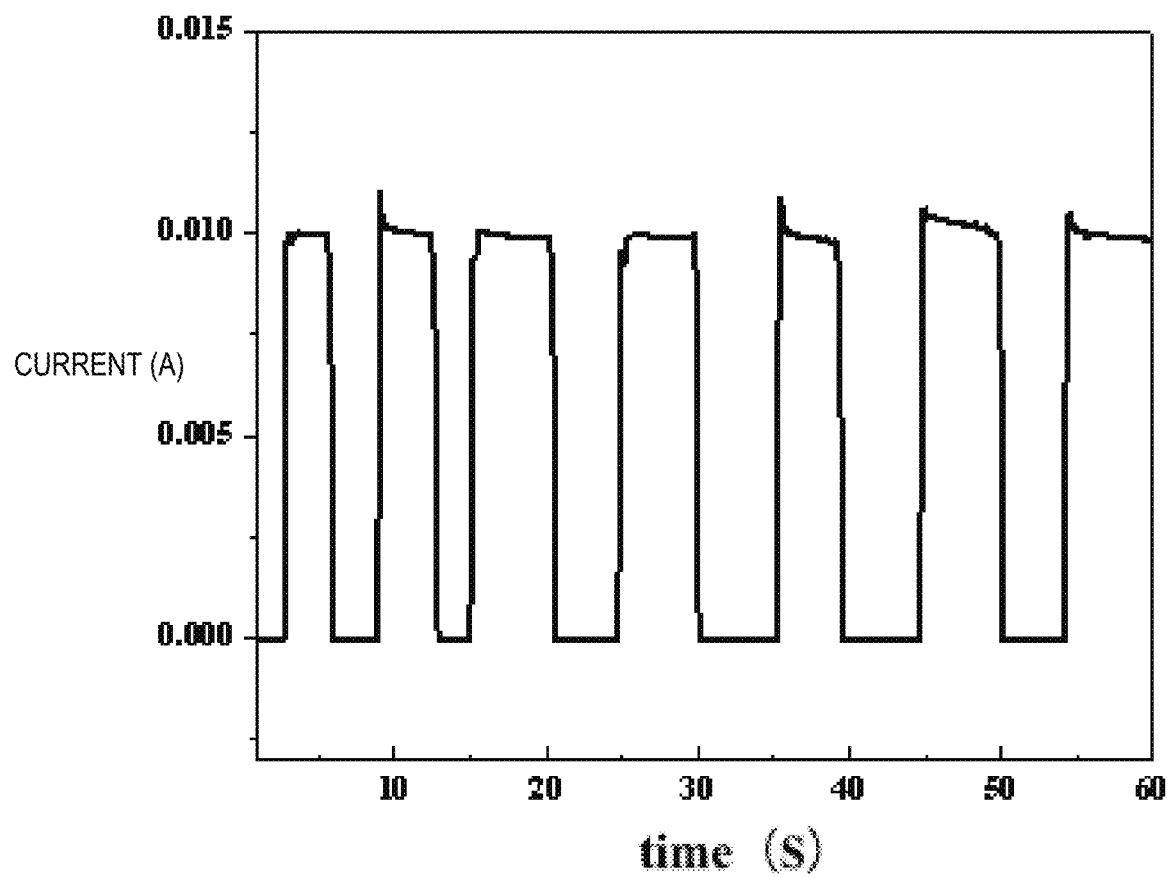
FIG. 9 is a graph showing a curve of electrical self-healing current versus time for a PAA+γ-PGAA+$Fe^{3+}$/GC+$H_2O$ hydrogel prepared according to Example 3.

A SEM observation for the PAA+γ-PGAA+$Fe^{3+}$/GC+$H_2O$ hydrogel prepared in Example 3 was done respectively before and after the healing thereof. It was found that the cut portion had completely healed as shown in FIG. 8A and FIG. 8B. An electric self-healing curve of the hydrogel was measured by an electrochemical workstation, as shown in FIG. 9, and it was found that the electrical signal of the hydrogel could return to a normal state within 0.6 seconds.

Figure 10:
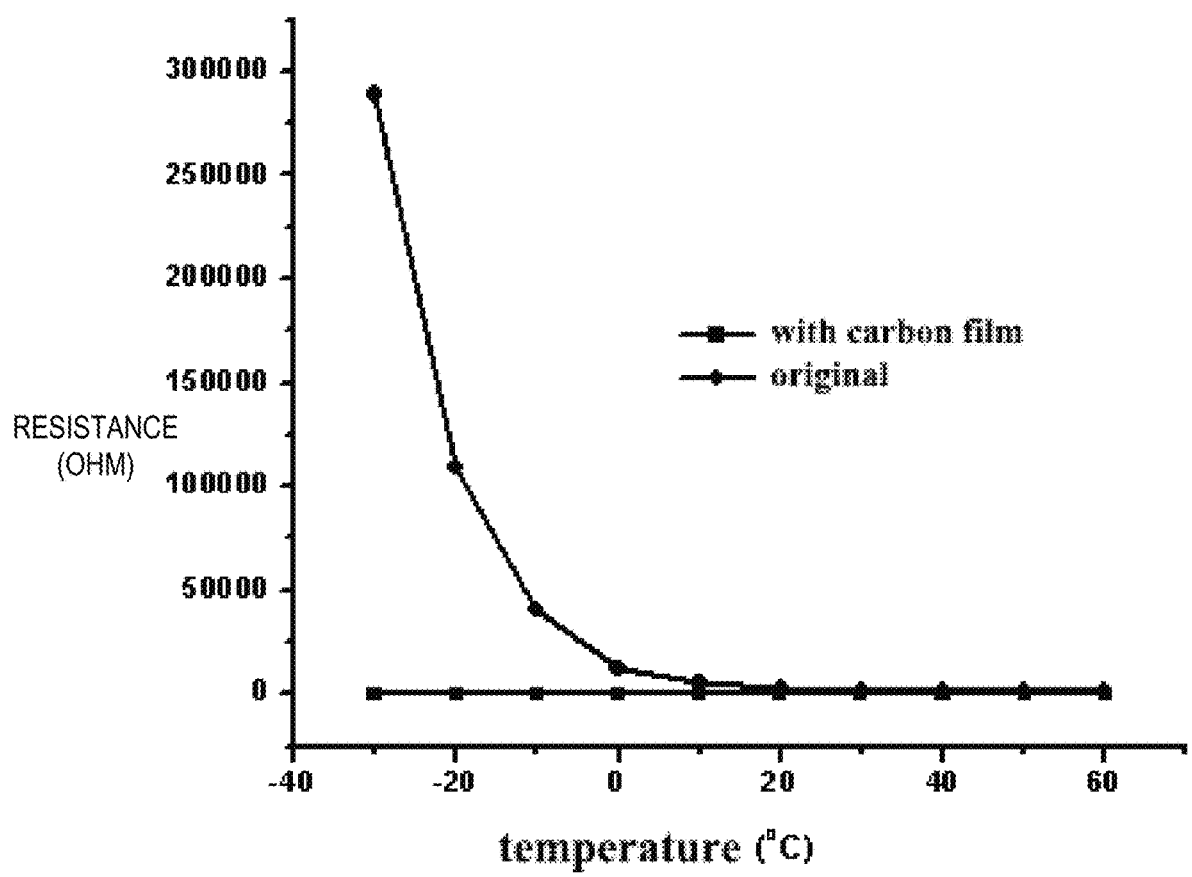
FIG. 10 is a graph showing curves of temperature versus resistance for a composite carbon film hydrogel prepared according to Example 4 and a carbon film-free hydrogel.
Figure 11:
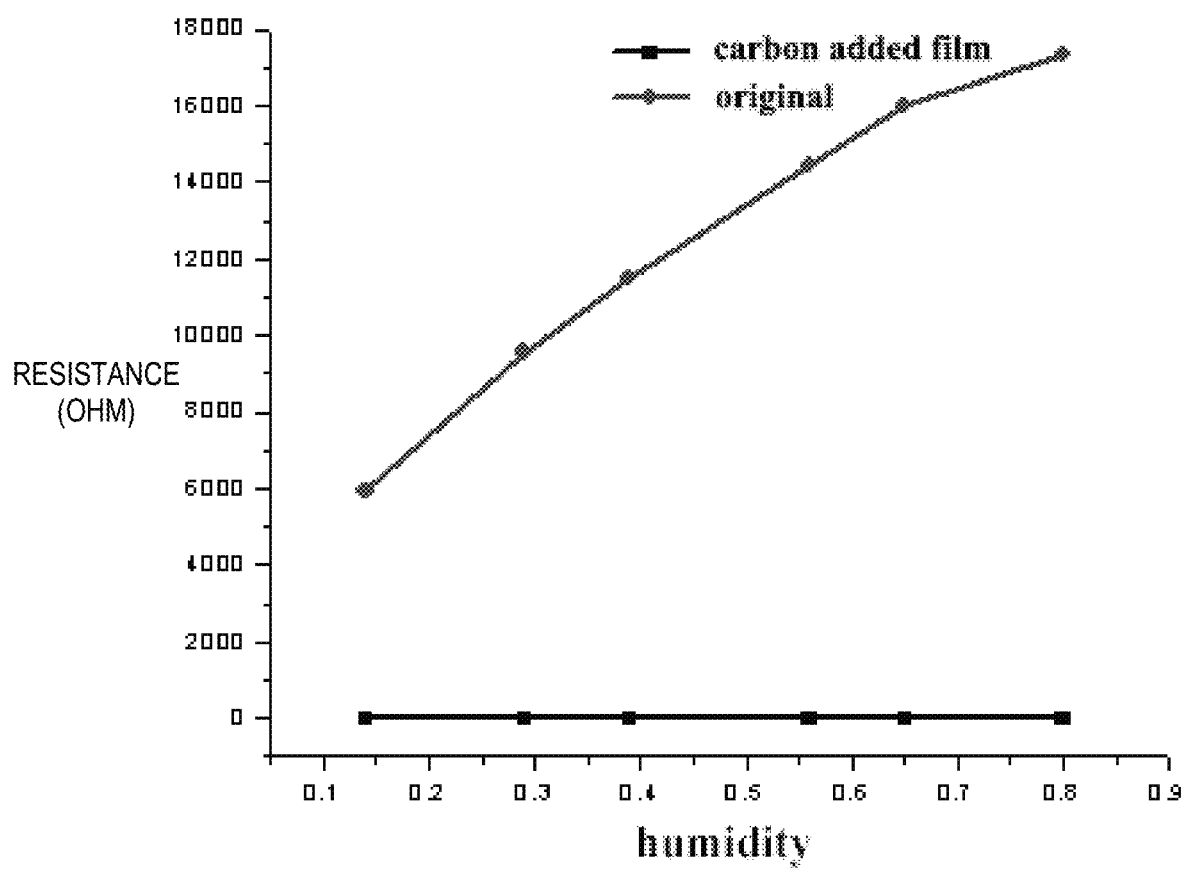
FIG. 11 is a graph showing curves of humidity versus electrical resistance for a composite carbon film hydrogel prepared according to Example 4 and a carbon film-free hydrogel.
Figure 12:
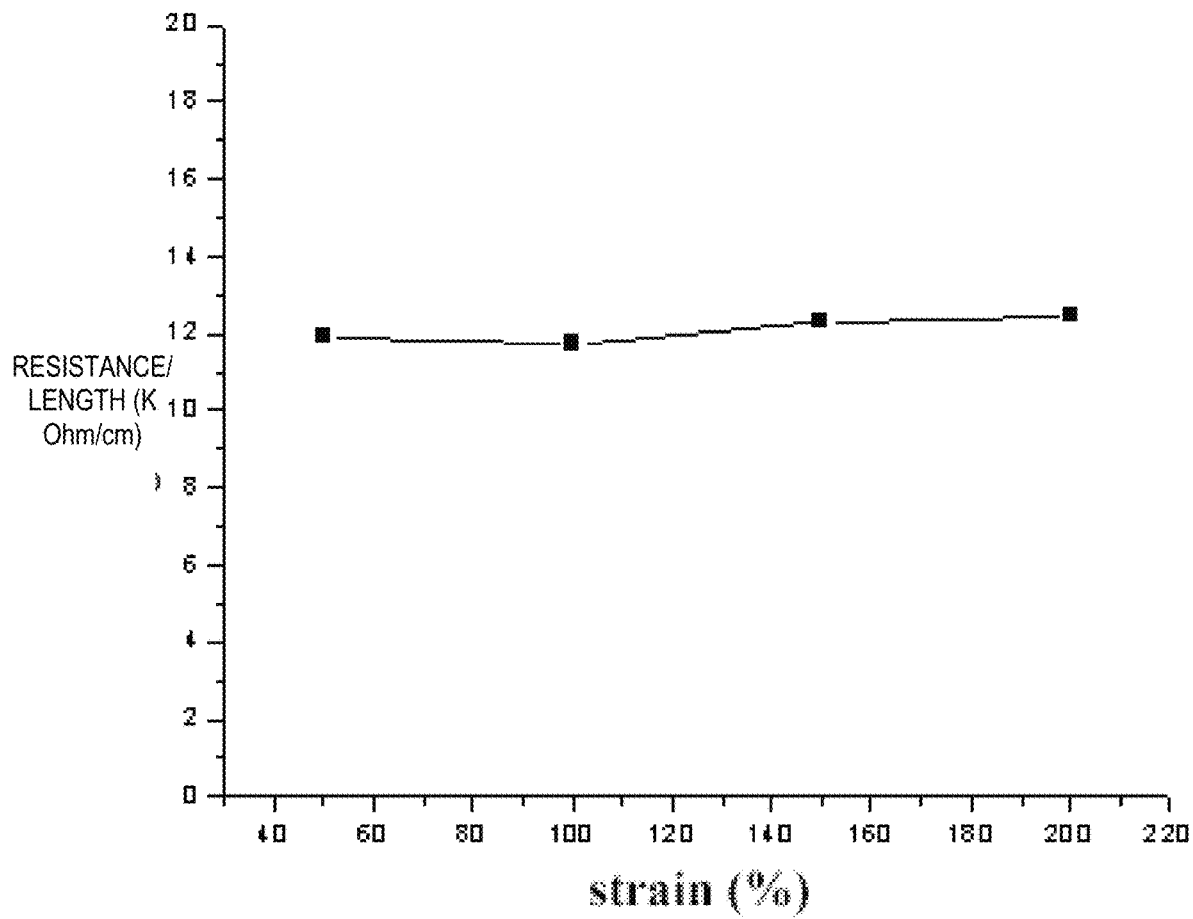
FIG. 12 is a graph showing a changing curve of electrical resistivity of a composite carbon film hydrogel prepared according to Example 4 upon stretching.

The composite carbon film hydrogel prepared in Example 4 was subjected to an experiment of humidity and temperature versus electrical conductivity. As shown in FIGS. 10 and 11, the resistance of the PAA+γ-PGAA+$Fe^{3+}$/GC+$H_2O$ hydrogel reaches 290K ohms when the temperature is below −30 degrees Celsius, and the resistance of the hydrogel after the composite carbon film is added reaches about 10 ohms, which does not change much. Similarly, when the humidity changes from 14% to 80%, the resistance of PAA+γ-PGAA+$Fe^{3+}$/GC+$H_2O$ hydrogel reaches 160K ohms, while the resistance of the hydrogel after the composite carbon film is added is still around 10 ohms. It is proved that the composite carbon film hydrogel has stable electrical conductivity, which does not change with changes in humidity and temperature. The composite carbon film hydrogel has almost the same resistivity within a tensile strength of 200%, as shown in FIG. 12. This will make it have a good application prospect in the fields of biomimetic biology, flexible electronic devices, biosensors, wearable devices, software robots, and the like.

What is claimed is:

1. An all-weather self-healing stretchable conductive material, wherein the all-weather self-healing stretchable conductive material is of a sandwich structure formed by sandwiching and adhering a sputtered metal, single-layer aligned composite carbon film between two pieces of polyacrylic acid and modified polyglutamic acid composite hydrogels.

2. A method for preparing an all-weather self-healing stretchable conductive material of claim 1, comprising:
(1) preparing a solution of acrylic acid, modified polyglutamic acid (γ-PGAA), ferric chloride hexahydrate ($FeCl_3 \cdot 6H_2O$), N,N'-methylenebisacrylamide (MBAA), ammonium persulfate (APS), Glycerol (GC) and $H_2O$ in proportion; passing a nitrogen gas for 30 minutes after mixing the solution uniformly so as to remove any gases in the solution, and effecting polymerization at 60° C. for 30 minutes to obtain at least two pieces of polyacrylic acid and modified polyglutamic acid composite hydrogels;

(2) sputtering a metal on a carbon film that is single-layer aligned by magnetron sputtering so as to prepare the sputtered metal composite carbon film;

(3) stretching the at least two pieces of polyacrylic acid and modified polyglutamic acid composite hydrogels by 200-500%;

(4) adhering one piece of the at least two pieces of polyacrylic acid and modified polyglutamic acid composite hydrogel that is stretched by 200-500% to one side of the sputtered metal composite carbon film, and after said one piece of hydrogel shrinks to its original length, adhering another piece of hydrogel from the hydrogels to the other side of the carbon film so as to form the all-weather self-healing stretchable conductive material of a sandwich structure where the sputtered metal composite carbon film is sandwiched and adhered between two same pieces of polyacrylic acid and modified polyglutamic acid composite hydrogels.

3. The method for preparing an all-weather self-healing stretchable conductive material according to claim 2, wherein in step (1), the modified polyglutamic acid (γ-PGAA) is prepared by the following process:

dissolving 2 g γ-PGA and 4 g allyl glycidyl ether fully in 25 mL deionized water, adjusting the pH to 2 to 4 with acetic acid, and reacting at room temperature for 36 hours; then effecting extraction for three times with dichloromethane, and collecting aqueous layer to obtain a γ-PGAA solution, so that a 50 mg/mL aqueous solution of γ-PGAA is prepared.

4. The method for preparing an all-weather self-healing stretchable conductive material according to claim 2, wherein in step (1), a volume ratio of GC to $H_2O$ is 0:6~6:0 both endpoints of which are excluded, an amount of γ-PGAA solution is greater than 0% but less than or equal to 80% of a total mass of the solution, and an amount of N, N'-MBAA is greater than 0% but less than or equal to 0.4% of a mass of acrylic acid, an amount of APS is 2% of the mass of acrylic acid, and an amount of $FeCl_3.6H_2O$ is 1.25% of an amount of acrylic acid substance.

5. The method for preparing an all-weather self-healing stretchable conductive material according to claim 4, wherein in step (1), the volume ratio of GC:$H_2O$ is 5:1, the amount of γ-PGAA solution is 40% of the total mass of the solution, the amount of N, N'-MBAA is 0.2% of the mass of acrylic acid, the amount of APS is 2% of the mass of acrylic acid, and the amount of $FeCl_3.6H_2O$ is 1.25% of the amount of the acrylic acid substance.

6. The method for preparing an all-weather self-healing stretchable conductive material according to claim 2, wherein sputtering a metal on a single-layer-aligned carbon film in step (2) comprises:

spreading the carbon film on a glass slide having a length of 7.5 cm and a width of 2.5 cm, and sputtering a metal on the carbon film by magnetron sputtering so as to obtain a composite carbon with a metal layer of a thickness of 20~80 nm and having a resistance of 2~10 ohms.

7. The method for preparing an all-weather self-healing stretchable conductive material according to claim 2, wherein the metal being sputtered on the single-layer-aligned carbon film in step (2) comprises gold, silver, or copper.

8. A manufactured device comprising the all-weather self-healing stretchable conductive material prepared according to the method of claim 2, wherein the manufactured device is of biomimetic biology equipment, flexible electronic equipment, biosensors, wearable devices, or soft-bodied robots using the all-weather self-healing stretchable conductive material.

* * * * *